United States Patent
Huang et al.

(10) Patent No.: US 7,786,625 B2
(45) Date of Patent: Aug. 31, 2010

(54) BUS STRUCTURE

(76) Inventors: Kuo-Ching Huang, 2F., No.43, Alley 6, Lane 137, Sec. 5, Minsheng E. Rd., Songshan District, Taipei City 105 (TW); Yu-Cheng Chang, No. 669, Ruey Kuang Road, Neihu, Taipei (TW)

( * ) Notice: Subject to any disclaimer, the term of this patent is extended or adjusted under 35 U.S.C. 154(b) by 859 days.

(21) Appl. No.: 11/668,331

(22) Filed: Jan. 29, 2007

(65) Prior Publication Data

US 2007/0187139 A1   Aug. 16, 2007

Related U.S. Application Data

(63) Continuation of application No. 11/136,558, filed on May 25, 2005, now Pat. No. 7,619,166.

(30) Foreign Application Priority Data

Sep. 7, 2004   (TW) ............................... 93127020 A

(51) Int. Cl.
*H02B 1/20* (2006.01)
*H05K 1/11* (2006.01)

(52) U.S. Cl. ...................................... 307/147; 174/254
(58) Field of Classification Search ................. 307/174; 174/68.1, 68.2, 254, 88 R, 88 B, 88 S, 84 S
See application file for complete search history.

(56) References Cited

U.S. PATENT DOCUMENTS

| 3,459,880 | A | * | 8/1969 | Erdle | 174/117 FF |
| 4,422,646 | A | * | 12/1983 | Rosa | 273/348.1 |
| 4,437,138 | A | | 3/1984 | Nicol | |
| 5,982,645 | A | * | 11/1999 | Levran et al. | 363/37 |

FOREIGN PATENT DOCUMENTS

| JP | 07045131 A | 2/1995 |
| JP | 2002171047 A | 6/2002 |
| JP | 2002344703 A | 11/2002 |

\* cited by examiner

*Primary Examiner*—Albert W Palandini
(74) *Attorney, Agent, or Firm*—Workman Nydegger

(57) ABSTRACT

A bus structure includes multiple soft buses and a soft separation layer. These multiple soft buses are stacked side by side each other. The soft separation layer is sandwiched between two adjacent soft buses.

8 Claims, 2 Drawing Sheets

BUS STRUCTURE

BACKGROUND OF THE INVENTION (1) Field of the Invention

The disclosure relates to a bus structure, and more particularly to a bus structure utilized in a scanning device.

(2) Description of the Prior Art

In order to transmit electric signal or energy, bus structure is widely used in electric device, for example, within a foldable electric device, a bus structure is often utilized to couple one separate part to the other, or to a movable part. Especially when the electric signal or energy is transmitted between two relatively motioning parts of an electric device, the flexible feature of a bus structure enables the electric device to operate smoothly.

The structure of a scanner is schematically shown in FIG. 1. As illustrated in FIG. 1, the scanner 2 includes a servo-controlled tube lamp 4, a circuit board 6 and a soft bus 8. The tube lamp 4 projects light on the scanned object, and an image sensor generating an image signal responding to the reflected light. The tube lamp 4 performs corresponding to a signal from the circuit board 6 which fixed at the bottom of the tube lamp 4, in addition, the soft bus 8 provides power and signal to the circuit board 6 to make the tube lamp 4 perform the predetermined action. Because the soft bus 8 is connected to the circuit board 6 fixed to the tube lamp 4, the flexible feature of the soft bus 8 is very important for the tube lamp 4 to operate smoothly.

As schematically shown in FIG. 2, according to the prior art, the bus structure 10 includes a plurality of soft buses 1002 and 1004. Nowadays, as a trend, the scanner becomes thinner in dimension and lighter in weight, so the wide bus structure 10 must be divided into several narrower soft buses, thus enabling the housing of the thinner scanner to accommodate the wider bus structure 10. Accordingly, as shown in FIG. 2, the bus structure 10 is divided into a first soft bus 1002 and a second soft bus 1004, either of which is narrower than the bus structure 10. The first soft bus 1002 and a second soft bus 1004 are stacked together to reduce the necessary depth of the scanner 2, which reducing the dimension of the scanner in depth.

The tube lamp 4 is designed to move forward and backward within the scanner 2, however, if the stacked first soft bus 1002 and second soft bus 1004 are adhered each other will double the thickness of the bus structure 10, so the flexibility of the bus structure 10, is reduced, in addition, the traction between the soft buses may further hinder the movement of the tube lamp 4. If the stacked first soft bus 1002 and second soft bus 1004 are not adhered each other, the first soft bus 1002 and second soft bus 1004 will contact each other to broke these soft bus 1002, 1004. Furthermore, because of the close attachment of the soft buses, the signals transmitted in the soft buses may interfere with each other, and the quality of the output image will thus be reduced.

Due to the disadvantages mentioned above, as the trend of slim design, it is very important to shrink the dimension of a scanner, and it is fundamental to improve the foregoing deficiency.

SUMMARY OF THE INVENTION

Accordingly, it is one object of the present invention to propose a bus structure which provides electricity and/or electronic signal between movable electronic parts within an electric device. The present invention can make the movable electronic part move with less traction than traditional one, i.e., the movable electronic part which coupled to the bus structure according to the present invention can move much more easier than the traditional one. In addition, the structure of the bus structure according to the present invention can shield mutual interference from the stacked part of the bus structure, so the image signal through the bus structure can be transmitted without mutual interference, and the resulted image quality of the electric device can be greatly improved.

The present invention relates to a bus structure utilized in a scanning device, the bus structure includes a plurality of soft buses and at least one soft separation layer. The bus structure splits in longitude to form the plurality of soft buses, and the plurality of soft buses are stacked and side by side arranged. Each soft separation layer is sandwiched between every two adjacent soft buses. Each of the plurality of soft buses includes a set of signal wires, each set of signal wires includes a plurality of signal wires which are parallel and side-by-side jointed in longitude. Thus every strip of soft bus are shield from each other by at least one soft separation layer.

In one preferred embodiment of the present invention, the plurality of soft buses are side by side placed, and every two adjacent soft buses are stacked together with a soft separation layer sandwiched therebetween. According to one of the preferred embodiments of the present invention, the soft separation layer can be made of foam material that possess smaller coefficient of fiction to the surface of soft bus than that between the soft buses, besides, the soft separation layer adheres to one of the two adjacent soft buses. So the traction from the moving bus structure according to the present invention is greatly reduced.

Accordingly, the bus structure in the present invention utilizing the soft separation layer makes it easier and smoother for the movable electronic part to move freely, and the adoption of signal wires greatly reduce the interference (such as cross talk) to the image signal, thus the quality of the resulted image is greatly improved.

BRIEF DESCRIPTION OF THE DRAWINGS

The present invention will now be specified with reference to its preferred embodiment illustrated in the drawings, in which.

DESCRIPTION OF THE PREFERRED EMBODIMENT

Figure 1:
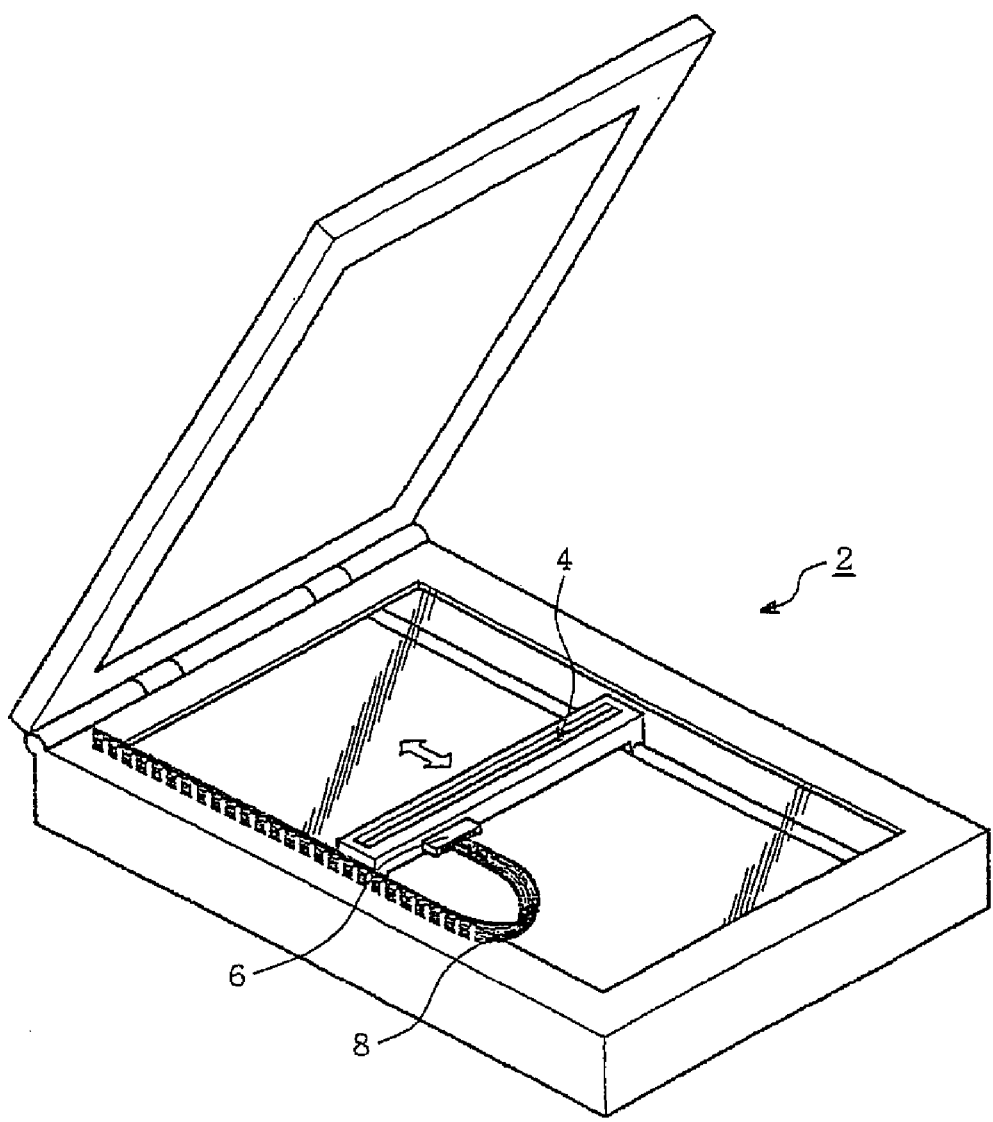
FIG. 1 is a schematic view of a scanner using a traditional soft bar.
Figure 2:
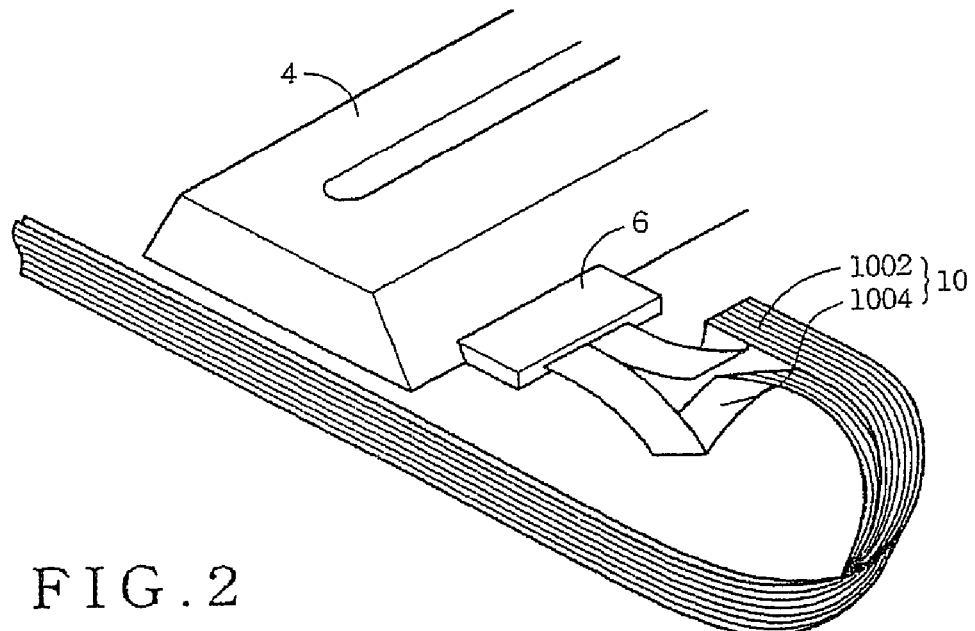
FIG. 2 illustrates a traditional bus structure coupling to a movable electronic part.
Figure 3:
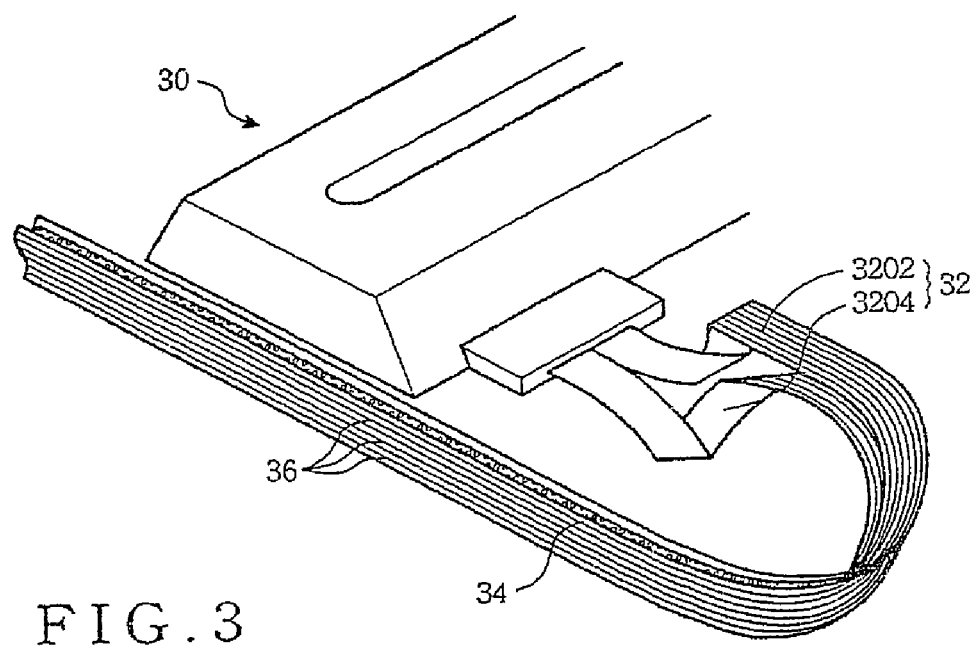
FIG. 3 illustrates a bus structure coupling to a movable electronic part, the bus structure is schematically illustrated according to one preferred embodiment of the present invention.

As schematically illustrates in FIG. 3, the perspective view of the bus structure 32 in accordance with a preferred embodiment of the present invention is coupled to the movable electronic part 30, in which, the bus structure 32 provides a path for power transmission and/or electronic signal communication to the moveable electronic part 30. Besides, in a foldable electric device, the bus structure 32 according to the preferred embodiment of the present invention can be used to provide power and signal communication between two or more separate parts of the foldable electric device.

As shown in FIG. 3, the bus structure 32 according to one preferred embodiment of the present invention includes a soft separation layer 34 and a plurality of soft buses, e.g., a first soft bus 3202 and a second soft bus 3204. In one end of the bus structure 32, it splits in longitude to form the first soft bus 3202 and the second soft bus 3204, in addition, the soft separation layer 34 is sandwiched between the first soft bus 3202 and the second soft bus 3204. Furthermore, the first soft bus 3202 and the second soft bus 3204 respectively includes a set of signal wires that are parallel arranged and jointed side by side in longitude, besides, these signal wires are used as isolation wires.

The first soft bus 3202 and the second bus 3204 are stacked side by side with the soft separation layer 34 sandwiched between thereof. In one of the preferred embodiment of the present invention, the soft separation layer 34 adheres to one of the soft buses 3202, 3204, besides, the coefficient of fiction between the surface of the soft separation layer 34 and the soft bus is smaller than that between the soft buses. The soft separation layer 34, in this preferred embodiment of the present invention can be made of foam material. Furthermore, according to one preferred embodiment of the present invention, the soft separation layer 34 is designed to adhere to one of the soft buses 3202, 3204, and only contact the other, thus making the bus structure 32 move without obstruction which resulted from the traditional bus structure.

In one of the preferred embodiments of the present invention, the sandwiched soft separation layer 34 can be formed in one piece with the soft buses 3202, 3204. In the other preferred embodiment, the soft separation layer 34 can be formed in several sections, which are separately manufactured in a process other than the process forming the soft buses 3202 and 3204. In this embodiment, the soft separation layer 34 is formed in several sections, so the whole structure, i.e., soft buses 3202 and 3204 and the sandwiched soft separation layer 34, have better flexibility.

According to the preferred embodiment of the present invention, because the bus structure 32 utilizes the soft separation layer 34, which is sandwiched between these adjacent soft buses 3202 and 3204, therefore the electronic part 30 can move with less traction from bus structure than the traditional one. In addition, the signal wires between the first soft bus 3202 and the second soft bus 3204 successfully isolate the interference from each other, thus the bus structure 32 according to the present invention can transmit signal with less interference (such as cross talk) and the resulted image quality is greatly improved.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

We claim:

1. A scanner comprising:
    a light source capable of projecting light onto an object to be scanned;
    a bus structure operatively associated with the light source, comprising:
        two or more soft buses which are disposed side by side; and
        a soft separation layer sandwiched between two adjacent soft buses, wherein the soft separation layer adheres only to one of the two adjacent soft buses and only contacts the other of the two adjacent soft buses such that traction between the two adjacent soft buses is reduced.

2. The scanner of claim 1, wherein the soft separation layer comprises two or more sections flexibly associated to one another.

3. The scanner of claim 1, wherein the bus structure is split in longitude to form the two or more soft buses.

4. The scanner of claim 1, wherein one or more of the two or more soft buses comprise a set of signal wires that are parallel arranged and jointed side by side in longitude.

5. A scanner, comprising:
    means for projecting light onto an object to be scanned;
    first means for providing electricity and/or electronic signals to the means for projecting light;
    second means for providing electricity and/or electronic signals to the means for projecting light; and
    means for reducing interference between the first and second means for providing electricity and/or electronic signals, wherein the means for reducing interference adheres only to one of the first and second means for providing electricity and/or electronic signals and only contacts the other of the first and second means for providing electricity and/or electronic signals such that traction between the first and second means for providing electricity and/or electronic signals is reduced.

6. The scanner of claim 5, wherein the means for reducing interference comprises two or more sections flexibly associated to one another.

7. A method comprising:
    projecting light onto an object to be scanned via a light source;
    providing electricity and/or electronic signals to the light source via first and second soft buses; and
    reducing interference between the first and second soft buses via a soft separation layer adhered only to one of the first and second buses and only contacts the other of the first and second soft buses such that traction between the first and second soft buses is reduced.

8. The method of claim 7, wherein the soft separation layer comprises two or more sections flexibly associated to one another.

* * * * *